(12) United States Patent
Bellman et al.

(10) Patent No.: US 10,413,948 B2
(45) Date of Patent: Sep. 17, 2019

(54) GLASS, GLASS-CERAMIC AND CERAMIC ARTICLES WITH LUBRICIOUS ANTI-FINGERPRINT COATINGS AND METHODS OF MAKING THE SAME

(71) Applicant: CORNING INCORPORATED, Corning, NY (US)

(72) Inventors: Robert Alan Bellman, Painted Post, NY (US); Benedict Yorke Johnson, Horseheads, NY (US); Carlo Anthony Kosik Williams, Painted Post, NY (US); Eric Louis Null, Corning, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 15/955,115

(22) Filed: Apr. 17, 2018

(65) Prior Publication Data
US 2018/0304322 A1   Oct. 25, 2018

Related U.S. Application Data

(60) Provisional application No. 62/489,781, filed on Apr. 25, 2017.

(51) Int. Cl.
| | | |
|---|---|---|
| *H05K 1/03* | (2006.01) | |
| *H05K 3/46* | (2006.01) | |
| *B08B 17/02* | (2006.01) | |
| *C03C 17/30* | (2006.01) | |
| *H05K 5/03* | (2006.01) | |
| *H05K 5/00* | (2006.01) | |

(52) U.S. Cl.
CPC .............. *B08B 17/02* (2013.01); *C03C 17/30* (2013.01); *H05K 5/0017* (2013.01); *H05K 5/03* (2013.01); *C03C 2217/75* (2013.01); *C03C 2217/76* (2013.01)

(58) Field of Classification Search
CPC .... H05K 1/0313; H05K 1/0353; H05K 1/036; H05K 3/4673; H05K 3/4644
See application file for complete search history.

(56) References Cited

U.S. PATENT DOCUMENTS

| | | | |
|---|---|---|---|
| 8,043,421 B2 | 10/2011 | Kato et al. | |
| 8,268,067 B2 | 9/2012 | Iyer et al. | |
| 8,974,924 B2 | 3/2015 | Weber et al. | |
| 2011/0159299 A1 | 6/2011 | Linforf et al. | |
| 2014/0147654 A1 | 5/2014 | Walther et al. | |

FOREIGN PATENT DOCUMENTS

WO        2016101185 A1    6/2016

OTHER PUBLICATIONS

International Search Report and Written Opinion of the International Searching Authority; PCT/US2018/029063; dated July 25, 2018; 11 Pages; European Patent Office.

*Primary Examiner* — Jeremy C Norris
(74) *Attorney, Agent, or Firm* — Timothy M. Schaeberle

(57) ABSTRACT

An article that includes: a glass, glass-ceramic or ceramic substrate comprising a primary surface; and an easy-to-clean (ETC) coating disposed over the primary surface, the coating comprising a bound ETC component and a mobile ETC component. Further, the bound ETC component comprises a perfluoropolyether (PFPE) silane. In addition, the mobile ETC component is disposed on or within the bound ETC component and comprises a fluorinated material, the mobile ETC component configured for movement relative to the bound ETC component.

26 Claims, 8 Drawing Sheets

GLASS, GLASS-CERAMIC AND CERAMIC ARTICLES WITH LUBRICIOUS ANTI-FINGERPRINT COATINGS AND METHODS OF MAKING THE SAME

CROSS-REFERENCE TO RELATED APPLICATIONS

This application claims the benefit of priority under 35 U.S.C. § 119 of U.S. Provisional Application Ser. No. 62/489,781 filed on Apr. 25, 2017, the content of which is relied upon and incorporated herein by reference in its entirety.

FIELD

The present disclosure generally relates to glass, glass-ceramic and ceramic articles with lubricious coatings; and, more particularly, to articles having strengthened glass substrates with lubricious, anti-fingerprint coatings with high durability and methods of making the same.

BACKGROUND

Glass, glass-ceramic and ceramic materials, many of which are configured or otherwise processed with various strength-enhancing features, are prevalent in various displays and display devices of many consumer electronic products. For example, chemically strengthened glass is favored for many touch-screen products, including cell phones, music players, e-book readers, notepads, tablets, laptop computers, automatic teller machines, and other similar devices. Many of these glass, glass-ceramic and ceramic materials are also employed in displays and display devices of consumer electronic products that do not have touch-screen capability, but are prone to direct human contact, including desktop computers, laptop computers, elevator screens, equipment displays, and others.

These glass, glass-ceramic and ceramic materials, however, are often subject to human contact that can result in surface contamination, visible fingerprints, staining, and other foreign substances that can affect optical clarity of the displays and display devices employing these materials. In addition, these displays and display devices frequently employ optical coatings, such as anti-reflective (AR) coatings that are particularly prone to surface contamination, stains and the like from direct human contact. Further, these unwanted foreign substances can negatively affect the aesthetics of the products employing these displays and display devices. In addition, these reductions in optical clarity can cause a user to increase the brightness of the display device, leading to increased battery usage and less time between charging evolutions.

In view of these considerations and drawbacks associated with glass, glass-ceramic and ceramic material surfaces, many consumer electronic products employing these materials also feature an easy-to-clean (ETC) coating over any surfaces of the glass, glass-ceramic and ceramic substrates exposed to human contact and any other optical coatings, if present. Many of these ETC coatings contain one or more fluorinated materials. These ETC coatings are generally hydrophobic and oleophobic in nature, and can also be referred to as "anti-fingerprint," "lubricious" or "anti-smudge" coatings. Among the benefits offered by ETC coatings is an added degree of ease in removing fingerprints, stains and other surface contamination from these glass, glass-ceramic and ceramic materials. ETC coatings, given their hydrophobic and oleophobic nature, are also less likely to retain or be prone to surface contamination from human contact in the first instance.

While ETC coatings offer many benefits to electronic products employing glass, glass-ceramic and ceramic materials in their displays and display devices, the coatings themselves can be sensitive to wear. For example, wear associated with these coatings can negatively affect their hydrophobicity and/or oleophobicity, which can reduce the ability of the coating to perform as intended. In addition, the wear associated with these ETC coatings can be exacerbated by the presence of an optical coating and/or scratch-resistant coating between the ETC coating and the glass, glass-ceramic or ceramic materials, as these intervening coatings can have increased roughness relative to the exposed surface of the glass, glass-ceramic or ceramic material itself. In addition, the added cost associated with ETC coating materials and processing can make such coatings less desirable for use on glass, glass-ceramic and ceramic materials and substrates employed in certain consumer electronic products with high consumer cost sensitivity.

In view of these considerations, there is a need for glass, glass-ceramic and ceramic articles with lubricious coatings with high durability, along with methods of making the same. In addition, there is a need for glass, glass-ceramic and ceramic articles with lubricious coatings having a high durability and low added cost associated with the coating.

SUMMARY

A first aspect of this disclosure pertains to an article that includes: a glass, glass-ceramic or ceramic substrate comprising a primary surface; and an easy-to-clean (ETC) coating disposed over the primary surface, the coating comprising a bound ETC component and a mobile ETC component. Further, the bound ETC component comprises a perfluoropolyether (PFPE) silane. In addition, the mobile ETC component is disposed on or within the bound ETC component and comprises a fluorinated material, the mobile ETC component configured for movement relative to the bound ETC component.

In a second aspect according to the first aspect, the mobile ETC component is at least partially soluble within the bound ETC component.

A third aspect according to any of the preceding aspects, wherein an exposed surface of the ETC coating comprises an average contact angle with water of at least 70 degrees after being subjected to 2000 reciprocating cycles under a load of 1 kg according to a Steel Wool Test.

A fourth aspect according to any of the preceding aspects, wherein an exposed surface of the ETC coating comprises an average contact angle with water of at least 70 degrees after being subjected to 3500 reciprocating cycles under a load of 1 kg according to a Steel Wool Test.

A fifth aspect according to any of the preceding aspects, wherein the article comprises a haze through the coating and the substrate of less than or equal to about 5 percent.

A sixth aspect according to any of the preceding aspects, wherein the substrate comprises a glass composition and a compressive stress region, the compressive stress region extending from the primary surface to a first selected depth in the substrate.

A seventh aspect according to any of the preceding aspects, the mobile ETC component can also include the PFPE silane of the bound ETC component.

An eighth aspect according to any of the preceding aspects, further comprising an optical coating disposed between the primary surface of the substrate and the ETC coating, wherein the optical coating is a multilayer coating.

A ninth aspect according to any of the preceding aspects, further comprising a scratch-resistant coating disposed between the primary surface of the substrate and the ETC coating, wherein the scratch-resistant coating comprises at least one of a metal oxide and a metal nitride.

A tenth aspect according to any of the preceding aspects, wherein the bound ETC component further comprises a thickness between about 1 nm and about 20 nm.

An eleventh aspect of the disclosure pertains to an article that includes: a glass, glass-ceramic or ceramic substrate comprising a primary surface; and an easy-to-clean (ETC) coating disposed over the primary surface, the coating comprising a bound ETC component and a mobile ETC component. Further, the bound ETC component comprises a perfluoropolyether (PFPE) silane. In addition, the mobile ETC component is disposed on the bound ETC component and comprises a PFPE oil, the mobile ETC component configured for movement relative to the bound ETC component.

A twelfth aspect according to the eleventh aspect, wherein an exposed surface of the ETC coating comprises an average contact angle with water of at least 70 degrees after being subjected to 2000 reciprocating cycles under a load of 1 kg according to a Steel Wool Test.

A thirteenth aspect according to the eleventh or twelfth aspect, he exposed surface of the ETC coating can also comprise an average contact angle with water of at least 70 degrees after being subjected to 3500 reciprocating cycles under a load of 1 kg according to the Steel Wool Test.

A fourteenth aspect according to any of the eleventh through thirteenth aspects, wherein the article comprises a haze through the ETC coating and the glass, glass-ceramic or ceramic substrate of less than or equal to about 5 percent.

A fifteenth aspect according to any of the eleventh through fourteenth aspects, wherein the substrate comprises a glass composition and a compressive stress region, the compressive stress region extending from the primary surface to a first selected depth in the substrate.

A sixteenth aspect according to any of the eleventh through fifteenth aspects, further comprising an optical coating disposed between the primary surface of the substrate and the ETC coating, wherein the optical coating is a multilayer coating.

A seventeenth aspect according to any of the eleventh through sixteenth aspects, further comprising a scratch-resistant coating disposed between the primary surface of the substrate and the ETC coating, wherein the scratch-resistant coating comprises at least one of a metal oxide and a metal nitride.

An eighteenth aspect according to any of the eleventh through seventeenth aspects, wherein the bound ETC component further comprises a thickness between about 1 nm and about 20 nm.

A nineteenth aspect of the disclosure pertains to a method of making an article that includes: depositing an easy-to-clean (ETC) coating precursor over a primary surface of a glass, glass-ceramic or ceramic substrate; curing the ETC coating precursor to define a cured ETC coating precursor that comprises a bound ETC component; and processing the cured ETC coating precursor to define an ETC coating that comprises the bound ETC component and a mobile ETC component. Further, the bound ETC component comprises a perfluoropolyether (PFPE) silane. In addition, the mobile ETC component is disposed on or within the bound ETC component and comprises a fluorinated material, the mobile ETC component configured for movement relative to the bound ETC component.

A twentieth aspect according to the nineteenth aspect, wherein the mobile ETC component comprises the PFPE silane of the bound ETC component and the processing comprises a controlled wipe of the cured ETC coating precursor to define the ETC coating.

A twenty-first aspect according to the nineteenth or the twentieth aspect, wherein the article comprises a haze through the ETC coating and the substrate of less than or equal to about 5 percent after the curing step.

A twenty-second aspect according to any of the nineteenth through twenty-first aspects, wherein the processing of the cured ETC coating precursor comprises depositing a PFPE oil over the cured ETC coating precursor to define the ETC coating, wherein the mobile ETC component comprises the PFPE oil.

A twenty-third aspect according to the twenty-second aspect, wherein the processing of the cured ETC coating precursor further comprises rinsing the cured ETC coating precursor with a solvent prior to the step of depositing the PFPE oil over the cured ETC coating precursor, and further wherein the rinsing is conducted to remove an excess amount of at least one of the ETC coating precursor and the cured ETC coating precursor over the primary surface of the substrate.

A twenty-fourth aspect according to any of the nineteenth through twenty-third aspects, wherein the bound ETC component further comprises a thickness between about 1 nm and about 20 nm.

In a twenty-fifth aspect, the disclosure pertains to a consumer electronic product comprising a housing having a front surface, a back surface and side surfaces; electrical components provided at least partially within the housing, the electrical components including at least a controller, a memory, and a display, the display being provided at or adjacent the front surface of the housing; and a cover substrate disposed over the display, wherein at least one of a portion of the housing or the cover substrate comprises the article of any of the first through eighteenth aspects.

In some implementations of the articles of the disclosure, the glass, glass-ceramic and ceramic substrate comprises a compressive stress region, the compressive stress region extending from the primary surface to a first selected depth. The maximum compressive stress, in some embodiments, within the compressive stress region can be about 100 MPa or greater, 200 MPa or greater, 300 MPa or greater, 400 MPa or greater, 500 MPa or greater, 600 MPa or greater, 700 MPa or greater, 800 MPa or greater, 900 MPa or greater, 1000 MPa or greater, and all values between these maximum compressive stress levels.

In additional implementations of the articles of the disclosure, the bound ETC component further comprises a thickness between about 1 nm and about 20 nm. According to some embodiments, the thickness of the bound ETC component can range from about 1 nm to about 100 nm, from about 1 nm to about 50 nm, from about 1 nm to about 25 nm, from about 1 nm to about 20 nm, from about 5 nm to about 25 nm, and all thickness values within these ranges.

Additional features and advantages will be set forth in the detailed description which follows, and will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the disclosure as it is claimed.

The accompanying drawings are included to provide a further understanding of principles of the disclosure, and are incorporated in, and constitute a part of, this specification. The drawings illustrate one or more embodiment(s) and, together with the description, serve to explain, by way of example, principles and operation of the disclosure. It is to be understood that various features of the disclosure disclosed in this specification and in the drawings can be used in any and all combinations. By way of non-limiting examples, the various features of the disclosure may be combined with one another according to the following aspects.

BRIEF DESCRIPTION OF THE DRAWINGS

These and other features, aspects and advantages of the present disclosure are better understood when the following detailed description of the disclosure is read with reference to the accompanying drawings, in which.

DETAILED DESCRIPTION

Figure 1:
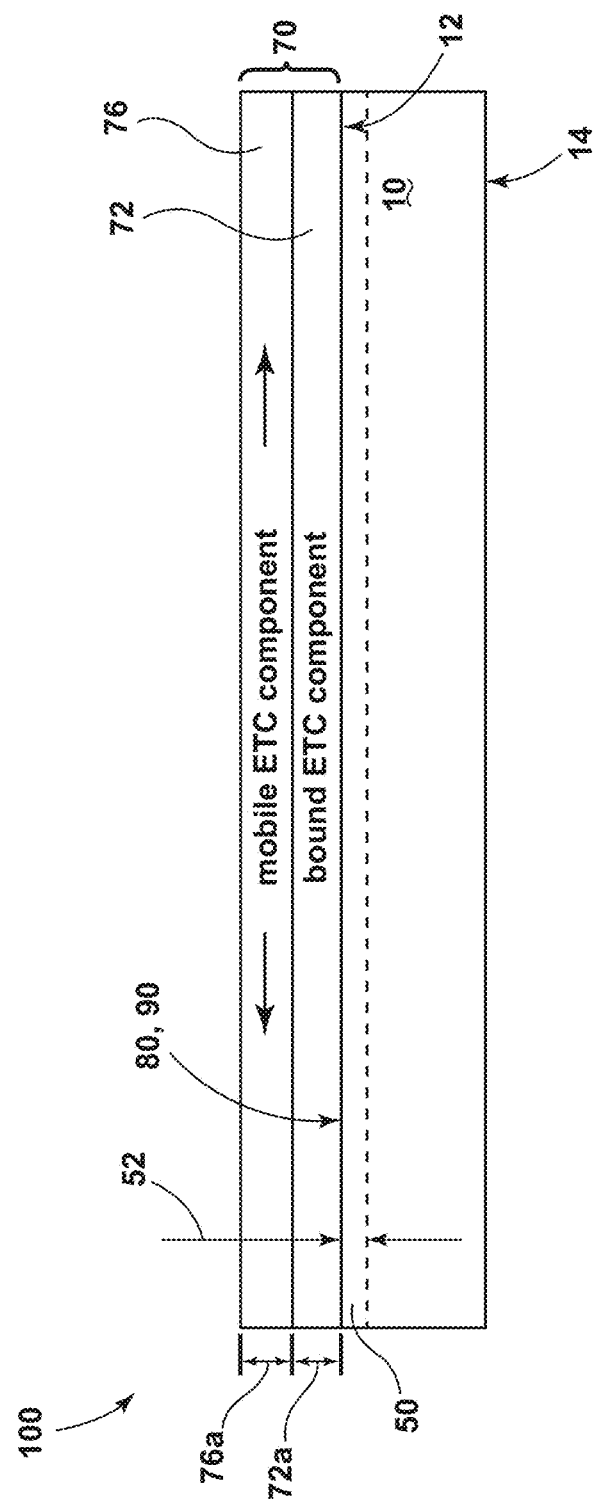
FIG. 1 is a cross-sectional, schematic view of an article comprising a substrate with an ETC coating disposed over the substrate, according to an aspect of the disclosure.

In the following detailed description, for purposes of explanation and not limitation, example embodiments disclosing specific details are set forth to provide a thorough understanding of various principles of the present disclosure. However, it will be apparent to one having ordinary skill in the art, having had the benefit of the present disclosure, that the present disclosure may be practiced in other embodiments that depart from the specific details disclosed herein. Moreover, descriptions of well-known devices, methods and materials may be omitted so as not to obscure the description of various principles of the present disclosure. Finally, wherever applicable, like reference numerals refer to like elements.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Directional terms as used herein—for example up, down, right, left, front, back, top, bottom—are made only with reference to the figures as drawn and are not intended to imply absolute orientation.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

As used herein, the singular forms "a," "an" and "the" include plural referents unless the context clearly dictates otherwise. Thus, for example, reference to a "component" includes aspects having two or more such components, unless the context clearly indicates otherwise.

Aspects of the disclosure generally pertain to articles having glass, glass-ceramic and ceramic substrates with lubricious, anti-fingerprint and easy-to-clean (ETC) coatings with high durability and methods of making the same. These lubricious ETC coatings are disposed directly on a glass, glass-ceramic or ceramic substrate or over one or more intervening layers (e.g., an optical coating, a scratch-resistant coating, a silica-containing capping layer and combinations thereof) between the ETC coating and the substrate. As used herein "easy-to-clean (ETC) coating" refers to a fluorinated coating material, including, but not limited to, perfluoropolyether (PFPE) silanes, perfluoropolyether (PFPE) alkoxy silanes, copolymers of these PFPEs and mixtures of these PFPEs. Further, the ETC coatings incorporate two components: (a) a bound ETC component; and (b) a mobile ETC component disposed over and/or within the bound ETC component. As used herein, "a bound ETC component" is a bound component attached through an alkoxysilane or other suitable attachment chemistry (e.g., halides, amines, silazanes, etc.), for example, to the glass, glass-ceramic or ceramic substrate and/or any silica-containing capping layer, if present. As used herein, "a mobile ETC component" is a component capable of movement (e.g., movement relative to the underlying bound ETC component) to lubricate contact with opposing surfaces (e.g., surfaces and objects that would otherwise lead to premature wear of the ETC coating). In some cases, the mobile ETC component may be partially soluble in the covalently bonded, bound ETC component. Perfluoropolyether (PFPE) and other lubricious fluorinated material compositions are suitable to use for the bound and mobile ETC components. Further, the bound and mobile ETC components may possess the same composition or differing compositions.

Referring to FIG. 1, an article 100 is depicted that includes: a glass, glass-ceramic or ceramic substrate 10 comprising a glass, glass-ceramic or ceramic composition. The substrate 10 comprises a pair of opposing primary surfaces 12, 14. Further, the article 100 includes an easy-to-clean (ETC) coating 70 disposed over the primary surface 12, the coating 70 comprising a bound ETC component 72 and a mobile ETC component 76. Further, the bound and mobile ETC components 72, 76 are defined by thicknesses 72a, 76a, respectively.

In some embodiments of the article 100, the substrate 10 comprises a glass composition. The substrate 10, for example, can comprise a borosilicate glass, an aluminosilicate glass, soda-lime glass, chemically strengthened borosilicate glass, chemically strengthened aluminosilicate glass, and chemically strengthened soda-lime glass. The substrate may have a selected length and width, or diameter, to define its area. The substrate may have at least one edge between the primary surfaces 12, 14 of the substrate 10 defined by its length and width, or diameter. The substrate 10 may also have a selected thickness. In some embodiments, the substrate has a thickness of from about 0.2 mm to about 1.5 mm, from about 0.2 mm to about 1.3 mm, and from about 0.2 mm to about 1.0 mm, or any ranges therebetween. According to some aspects, the substrate 10 comprises a compressive stress region 50 (see FIG. 1) that extends from at least one of the primary surfaces 12, 14 to a selected depth 52. As used herein, a "selected depth," (e.g., selected depth 52) "depth of layer" and "DOL" are used interchangeably to define the extent of the compressive stress region 50 within the substrate 10 containing a compressive stress of greater than about 0.1 MPa. As also used herein, the "maximum compressive stress" is defined as the maximum compressive stress within the compressive stress region 50 in the substrate 10. In some embodiments, the maximum compressive stress is obtained at or in close proximity to the one or more primary surfaces 12, 14 defining the compressive stress region 50. In other embodiments, the maximum compressive stress is obtained between the one or more primary surfaces 12, 14 and the selected depth 52 of the compressive stress region 50.

In some implementations of the article 100, as depicted in exemplary form in FIG. 1, substrate 10 is selected from a chemically strengthened aluminosilicate glass. In other embodiments, the substrate 10 is selected from chemically strengthened aluminosilicate glass having a compressive stress region 50 extending to a first selected depth 52 of greater than 10 µm, with a maximum compressive stress of greater than 150 MPa. In further embodiments, the substrate 10 is selected from a chemically strengthened aluminosilicate glass having a compressive stress region 50 extending to a first selected depth 52 of greater than 25 µm, with a maximum compressive stress of greater than 400 MPa. The substrate 10 of the article 100 may also include one or more compressive stress regions 50 that extend from one or more of the primary surfaces 12, 14 to a selected depth 52 (or depths) having a maximum compressive stress of greater than about 150 MPa, greater than 200 MPa, greater than 250 MPa, greater than 300 MPa, greater than 350 MPa, greater than 400 MPa, greater than 450 MPa, greater than 500 MPa, greater than 550 MPa, greater than 600 MPa, greater than 650 MPa, greater than 700 MPa, greater than 750 MPa, greater than 800 MPa, greater than 850 MPa, greater than 900 MPa, greater than 950 MPa, greater than 1,000 MPa, and all maximum compressive stress levels between these values. In addition, the depth of layer (DOL) or first selected depth 52 can be set at 10 µm or greater, 15 µm or greater, 20 µm or greater, 25 µm or greater, 30 µm or greater, 35 µm or greater and to even higher depths depending on the thickness of the substrate 10 and the processing conditions associated with generating the compressive stress region 50.

Similarly, with respect to glass-ceramics, the material chosen for substrate 10 of the article 100 can be any of a wide range of materials having both a glassy phase and a ceramic phase. Illustrative glass-ceramics include those materials where the glass phase is formed from a silicate, borosilicate, aluminosilicate, or boroaluminosilicate, and the ceramic phase is formed from β-spodumene, β-quartz, nepheline, kalsilite, petalite, or carnegieite.

With respect to ceramics, the material chosen for the substrate 10 of the article 100 can be any of a wide range of inorganic crystalline oxides, nitrides, carbides, oxynitrides, carbonitrides, and/or the like. Illustrative ceramics include those materials having an alumina, aluminum titanate, mullite, cordierite, zircon, spinel, perovskite, zirconia, ceria, silicon carbide, silicon nitride, silicon aluminum oxynitride or zeolite phase.

As depicted in FIG. 1, embodiments of the article 100 can include one or more of an optical coating 80 and a scratch-resistant coating 90 disposed over one or more primary surfaces 12, 14 of the substrate 10. As shown in FIG. 1, one or more of the coatings 80, 90 are disposed between the ETC coating 70 and the primary surface 12 of the substrate 10. According to some implementations, the coatings 80, 90 can also be disposed over the primary surface 14 of the substrate 10. With regard to the optical coating 80, it may include, for example, an anti-reflective (AR) coating, an anti-glare coating used in ultraviolet, visible and/or infrared applications, band-pass filter coatings, edge neutral mirror and beam splitter coatings, multi-layer high-reflectance coatings and edge filter coatings. It should be understood, however, that other optical functional coatings may be used to achieve a desired optical property of the resulting article 100.

Source materials for the optical coating 80 may comprise a multi-layer coating with each layer having a different refractive index. In some embodiments, the multi-layer coating comprises one or more low refractive index layers and one or more high refractive index layers, alternating in their sequencing over one another. For example, the optical coating 80 may include a low refractive index material L having a refractive index from about 1.3 to about 1.6, a medium refractive index material M having a refractive index from about 1.6 to about 1.7, or a high refractive index material H having a refractive index from about 1.7 to about 3.0. As used herein, the term "index" and "refractive index" both refer to the index of refraction of the material. Examples of suitable low refractive index materials include silica, fused silica, fluorine-doped fused silica, $MgF_2$, $CaF_2$, YF and $YbF_3$. Examples of suitable medium refractive index material include $Al_2O_3$. Examples of suitable high refractive index materials include $ZrO_2$, $HfO_2$, $Ta_2O_5$, $Nb_2O_5$, $TiO_2$, $Y_2O_3$, $Si_3N_4$, $SrTiO_3$ and $WO_3$. In some embodiments, the source materials for the optical coating 80 may also include transparent oxide coating (TCO) materials. Examples of suitable TCO materials may also include, but are not limited to, indium tin oxide (ITO), aluminum doped zinc oxide (AZO), zinc stabilized indium tin oxide (IZO), $In_2O_3$, and other binary, ternary or quarternary oxide compounds suitable for forming a doped metal oxide coating.

The source materials of the optical coating 80 may be deposited as a single layer coating or a multilayer coating. In some embodiments, a single layer coating is formed using a low refractive index material L as the optical coating source material. In other embodiments, a single layer coating is formed using a $MgF_2$ optical coating source material. The single layer coating may have a selected thickness. In some embodiments, the thickness of the single layer coating may be greater than or equal to 50 nm, 60 nm, or 70 nm. In some embodiments, the thickness of the single layer coating may be less than or equal to 2,000 nm, 1,500 nm, 1,000 nm, 500 nm, 250 nm, 150 nm or 100 nm.

The source materials for the optical coating 80 may also be deposited as a multilayer coating. In some embodiments, the multilayer coating may comprise alternating layers of a low refractive index material L, a medium refractive index material M, and a high refractive index material H. In other embodiments, the multilayer coating may comprise alternating layers of a high refractive index material H and one of (i) a low refractive index material L or (ii) a medium refractive index material M. The layers may be deposited such that the order of the layers is H(L or M) or (L or M)H. Each pair of layers, H(L or M) or (L or M)H, may form a coating period or period. The optical coating 80 may comprise at least one coating period to provide the desired optical properties, including, for example and without limitation, anti-reflective properties. In some embodiments, the optical coating 80 comprises a plurality of coating periods, wherein each coating period consisting of one high refractive index material and one of a low or medium refractive index material. The number of coating periods present in a multilayer coating may be from 1 to 1000. In some embodiments, the number of coating periods present in a multilayer coating may be from 1 to 500, from 2 to 500, from 2 to 200, from 2 to 100, or from 2 to 20.

The source materials of the optical coating 80 may be selected such that the same refractive index materials are used in each coating period, in some embodiments, or the optical coating source materials may be selected such that different refractive index materials are used in each coating period, in other embodiments. For example, in an optical coating 80 having two coating periods, the first coating period may comprise $SiO_2$ only and the second period may comprise $TiO_2/SiO_2$. The ability to vary the alternating layers and coating period may allow a complicated optical filter having the desired optical properties, and including an AR coating, to be formed.

The thickness of each layer in a coating period of the optical coating 80, i.e., the H layer and the L (or M) layer, may independently be from about 5 nm to about 200 nm, from about 5 nm to about 150 nm, or from about 25 nm to about 100 nm. The multilayer coating may have a thickness from about 100 nm to about 2000 nm, from about 150 nm to about 1500 nm, from about 200 nm to about 1250 nm, or from about 400 nm to about 1200 nm.

With regard to the scratch-resistant coating 90, it may include one or more scratch-resistant layers (e.g., diamond-like carbon, $Al_2O_3$, AlN, $AlO_xN_y$, $Si_3N_4$, $SiO_xN_y$, $Si_uAl_xO_yN_z$, TiN, TiC) disposed over one or more primary surfaces 12, 14 of the substrate 10. As shown in FIG. 1, a scratch-resistant coating 90 can be disposed between the ETC coating 70 and the primary surface 12 of the substrate 10. According to some implementations, the coating 90 can also be disposed over the primary surface 14 of the substrate 10.

The articles described herein may further comprise a capping layer of $SiO_2$ (not shown in FIG. 1) on the last layer of an optical coating 80, scratch-resistant coating 90 or primary surface 12, 14 of the substrate 10 in contact with the ETC coating 70. In some aspects, the capping layer can improve the bond between the component of the article 100 having the capping layer and the bound ETC component. In some embodiments, the capping layer is added when the last layer of the last coating period of the optical coating 80 is a high refractive index layer. In other embodiments, the capping layer is added when the last layer of the last coating period of the optical coating 80 is not $SiO_2$. In further embodiments, the capping layer may optionally be added when the last layer of the last coating period of the optical coating 80 is $SiO_2$. In some embodiments, the capping layer may have a thickness of from about 20 nm to about 400 nm, from about 20 nm to about 300 nm, from about 20 nm to about 250 nm, or from about 20 nm to about 200 nm. In other embodiments, the capping layer may have a thickness from about 1 nm to about 400 nm, from about 1 nm to about 300 nm, from about 1 nm to about 200 nm, from about 1 nm to about 100 nm, from about 1 nm to about 50 nm, or from about 1 nm to about 10 nm.

The optical coating 80 layers can be deposited using a variety of methods including physical vapor deposition ("PVD"), electron beam deposition ("e-beam" or "EB"), ion-assisted deposition-EB ("IAD-EB"), laser ablation, vacuum arc deposition, thermal evaporation, sputtering, plasma enhanced chemical vapor deposition (PECVD) and other similar deposition techniques.

In some implementations, the article 100 depicted in FIG. 1 includes: a glass, glass-ceramic or ceramic substrate 10 comprising primary surfaces 12, 14; and an easy-to-clean (ETC) coating 70 disposed over one or more of the primary surfaces 12, 14. The coating 70 can comprise a bound ETC component 72 and a mobile ETC component 76. In addition, the bound ETC component 72 comprises a perfluoropolyether (PFPE) silane and a thickness 72a between about 1 nm and about 20 nm. Further, the mobile ETC component 76 is disposed on or within the bound ETC component 72 and comprises a fluorinated material, the mobile ETC component 76 configured for movement relative to the bound ETC component 72. Given that the mobile ETC component 76 is disposed on or within the bound ETC component 72 in such configurations, the ETC component 76 can be soluble, partially soluble or insoluble with regard to the bound ETC component 72.

Figure 2A:
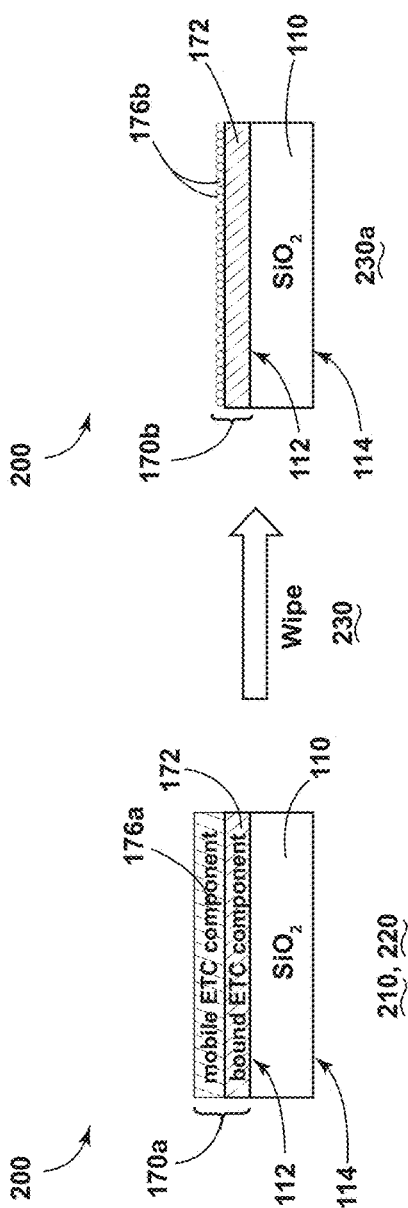
FIG. 2A is a cross-sectional, schematic view and flow chart of a process employed to make an article comprising a substrate with an ETC coating disposed over the substrate having mobile and bound ETC components comprising a PFPE silane, according to an embodiment of the disclosure.

According to an embodiment, an article 200 is depicted in FIG. 2A with a configuration that is comparable to the embodiment of the article 100 shown in FIG. 1 and described above, particularly with regard to its ETC coating. More particularly, the article 200 (as shown at step 230a on the right-hand side of FIG. 2A) includes: a glass, glass-ceramic or ceramic substrate 110 that comprises silica and primary surfaces 112, 114; and an easy-to-clean (ETC) coating 170b disposed over the primary surface 112. The coating 170b can comprise a bound ETC component 172 and a mobile ETC component 176b. The bound ETC component 172 comprises a perfluoropolyether (PFPE) silane and a thickness between about 1 nm and about 20 nm. In addition, the mobile ETC component 176b is disposed on the bound ETC component 172 and comprises a fluorinated material. Further, the mobile ETC component 176b is configured for movement relative to the bound ETC component 172. In embodiments, the mobile ETC component 176b comprises the same, or a substantially similar, PFPE silane of the bound ETC component 172. In some embodiments, the mobile ETC component 176b can be at least partially soluble within the bound ETC component 172; accordingly, the mobile ETC component 176b in this configuration is disposed on and within the bound ETC component 172.

Figure 2B:
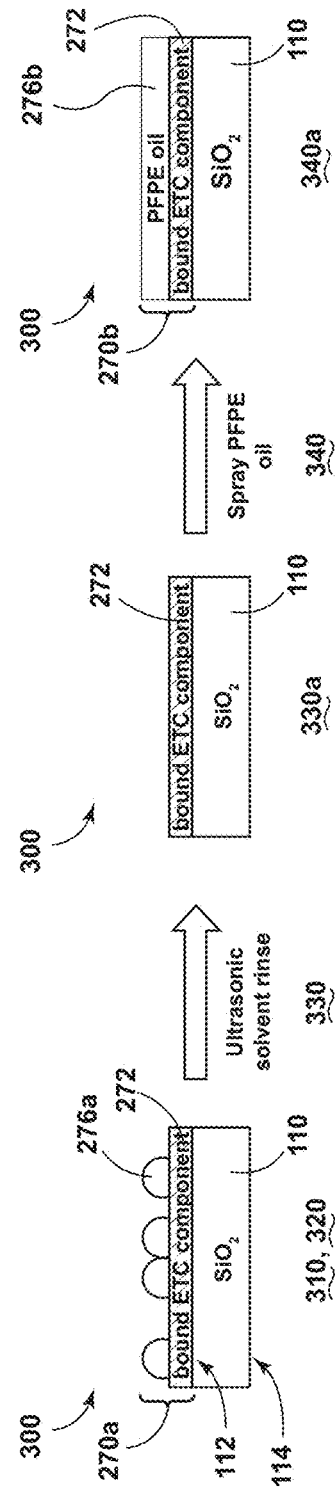
FIG. 2B is a cross-sectional, schematic view and flow chart of a process employed to make an article comprising a substrate with an ETC coating disposed over the substrate having a mobile ETC component comprising a PFPE oil and a bound ETC component comprising a PFPE silane, according to an embodiment of the disclosure.

In further implementations, the article 100 depicted in FIG. 1 is configured such that the mobile ETC component 76 is disposed on the bound ETC component 72 and comprises a PFPE oil. Given that the mobile ETC component 76 is disposed on the bound ETC component 72 in such configurations and comprises a PFPE oil, the ETC component 76 can be soluble, partially soluble or insoluble with regard to the bound ETC component 72. According to an embodiment, an article 300 is depicted in FIG. 2B with a configuration that is comparable to the embodiment of the article 100 shown in FIG. 1 and described above (i.e., with a mobile ETC component 76 that comprises a PFPE oil). More particularly, the article 300 (as shown at step 340a on the right-hand side of FIG. 2B) includes: a glass, glass-ceramic or ceramic substrate 110 that comprises silica and primary surfaces 212, 214; and an easy-to-clean (ETC) coating 270b disposed over the primary surface 112. The coating 270b can comprise a bound ETC component 272 and a mobile ETC component 276b. The bound ETC component 272 comprises a perfluoropolyether (PFPE) silane and a thickness between about 1 nm and about 20 nm. In addition, the mobile ETC component 276b is disposed on the bound ETC component 272 and comprises a PFPE oil. Further, the mobile ETC component 276b is configured for movement relative to the bound ETC component 272. In some embodiments, the mobile ETC component 276b can be at least partially soluble within the bound ETC component 272; accordingly, the mobile ETC component 276b in this configuration is disposed on the bound ETC component 272.

ETC coating source materials are used to form the ETC coating 70, 170b, 270b of the articles 100, 200, 300 depicted in FIGS. 1, 2A and 2B. ETC coating source materials may comprise perfluoropolyether (PFPE) silanes, perfluoropolyether (PFPEs) alkoxy silanes, copolymers of these PFPEs and mixtures of these PFPEs. In certain, exemplary embodiments of the articles of the disclosure, the ETC coating can comprise a perfluoropolyether (PFPE) silane of formula $[CF_3CF_2CF_2O)_a]_y SiX_{4-y}$, where a is from 5 to 50, y=1 or 2, and X is —Cl, acetoxy, —OCH$_3$ or OCH$_2$H$_3$, wherein the total perfluoropolyether chain length is 6-130 carbon atoms from the silicon atom to the end of the chain at its greatest length. In other aspects, "a" in the above formula can range from about 10 to 30. Further, it should be understood that the above PFPE formula is only one of many suitable types of PFPE suitable for use in the ETC coatings of the disclosure; consequently, it is offered as an exemplary chemistry that is in no way intended to limit the formulas or mixtures of formulas suitable for the ETC coatings of the disclosure. As such; other PFPEs can be employed in the ETC coatings that vary in the structure of the perfluoropolyether chain and/or attachment chemistry relative to the exemplary form provided above. For example, an Optool™ UF503 fluorinated coating material from Daikin Industries is another suitable PFPE that can be employed according to embodiments the ETC coating 70, 170b, 270b. As used herein, the length of the carbon chain in nanometers ("nm") is the product of the number of carbon-carbon bonds along the greatest length of the chain multiplied by the carbon-carbon single bond length of 0.154 nm. In some embodiments, the carbon chain length of the perfluoropolyether (PFPE) group can range from about 0.1 nm to about 50 nm, from about 0.5 nm to about 25 nm, or from about 1 nm to about 20 nm. As also noted earlier, embodiments of the ETC coating 70, 170b, 270b employed in the articles 100, 200, 300 (see FIGS. 1, 2A, 2B) can include a bound ETC component 72, 172, 272 that comprises any of the foregoing PFPEs. Further, the ETC coatings 70 of the articles 100, 200 can, in some embodiments, include a mobile ETC component 76, 176b, 276b that comprises any of the foregoing PFPEs.

Figure 3:
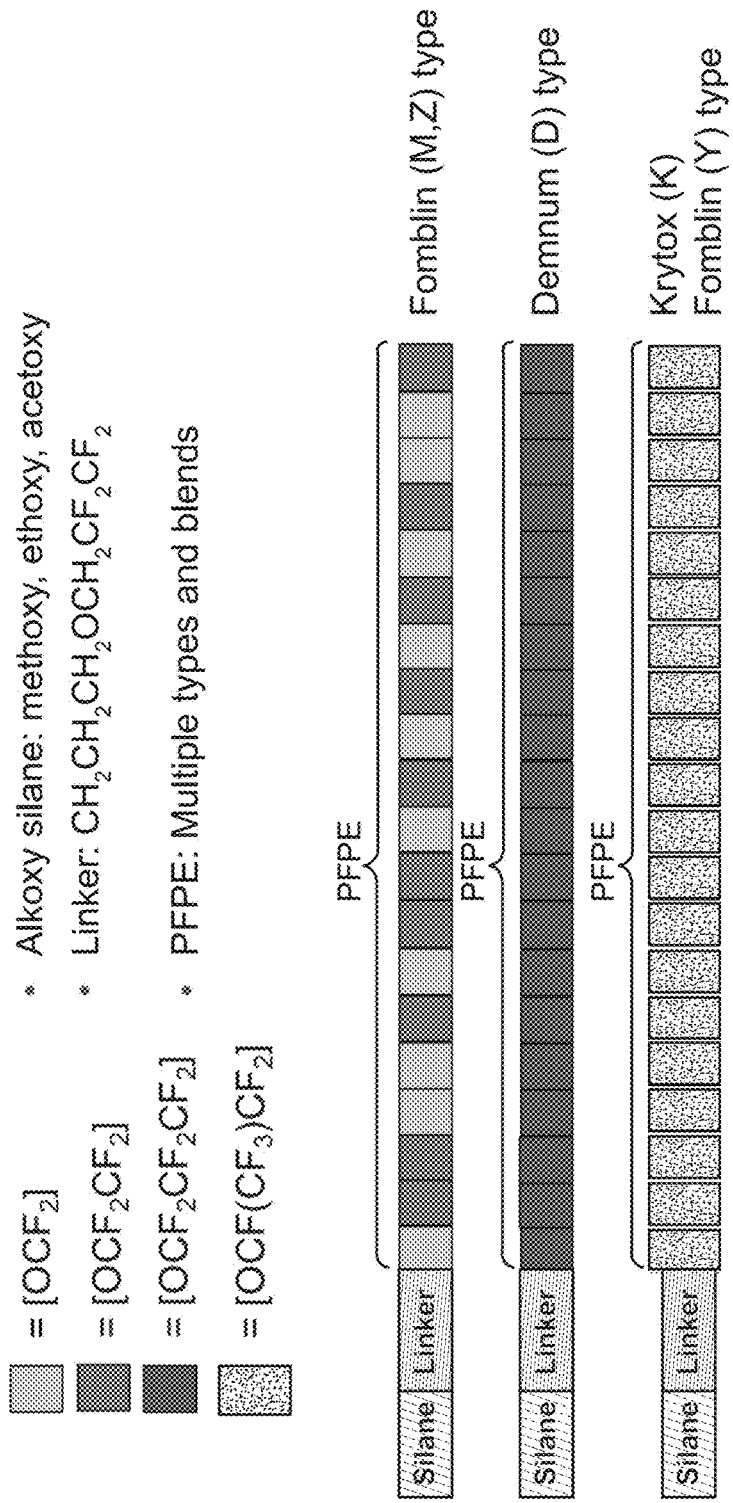
FIG. 3 is a chart of exemplary bound and mobile ETC component compositions that can be employed in an ETC coating of an article, according to embodiments of the disclosure.

As also noted earlier, embodiments of the ETC coating 70, 270b employed in the articles 100, 300 (see FIGS. 1, 2B) can include a mobile ETC component 76, 276b that comprises a PFPE oil. According to some embodiments, the PFPE oil employed as the mobile ETC component 76, 276b is a lubricious oil that can be solubilized in the bound ETC component 72, 272. In general, PFPE oils are characterized by oxidation resistance. In other aspects, the PFPE oil of the mobile ETC component 76, 276b is a discreet layer disposed over the bound ETC component 72, 272. In further aspects, the PFPE oil of the mobile ETC component 76, 276b is a combination of solubilized and discreet layers. According to some embodiments, the PFPE oil employed in the mobile ETC component can comprise a Solvay Fomblin® Z type oil, a Fomblin® Y type oil, a Fomblin® K type oil, Krytox™ K type oil from The Chemours Company, a Demnum™ type oil from Daikin Industries or other similar PFPE oil. Further, the compositions of these PFPE oils, as mobile ETC components, are shown in exemplary form in FIG. 3 (along with exemplary bound ETC components). As an example, Fomblin® K-type PFPE oils can be sourced through Ideal Vacuum Products LLC (or obtained directly from Solvay) and used according to embodiments of the disclosure. As another example, Fomblin® Z-type PIPE oils can be obtained from Solvay and Demnum™ PFPE oils can be sourced through Nye Lubricants (or obtained directly from Daikin Industries) and used according to embodiments of the disclosure. Without being bound by theory, it is reasonable to expect that the molecular weight of PFPE oils can influence performance within the ETC coating. For example, differences in the degree of the stabilization of the PFPE oil as the mobile ETC component can be expected depending on whether the molecular weight and shape (linear vs. branched) of the bound ETC component is the same or different from the PFPE oil.

The thickness of the ETC coating 70 (e.g., thickness 72a of the ETC coating 70 shown in FIG. 1), 170b, 270b may vary and can be applied such that it has a thickness sufficient to cover the entire primary surfaces 12, 112 and/or 14, 114 of the substrate 10, 110, optical coating 80 and/or scratch-resistant coating 90, provide for dense coverage of the ETC coating, and/or ensure better reliability. In some embodiments, the ETC coating may have a thickness of from about 0.5 nm to about 50 nm, from about 1 nm to about 25 nm, from about 4 nm to about 25 nm, or from about 5 nm to about 20 nm. In other embodiments, the ETC coating may have a thickness of from about 10 nm to about 50 nm.

In some embodiments, the articles 100, 200, 300 of the disclosure are configured such that the ETC coating 70, 170b, 270b, is characterized by a high durability. Accordingly, some embodiments of the articles 100, 200, 300 are configured such that an exposed surface of the ETC coating 70, 170b, 270b comprises an average contact angle with water of at least 70 degrees after being subjected to 2,000 reciprocating cycles under a load of 1 kg according to a Steel Wool Test (i.e., as described below). The exposed surface of the ETC coating 70, 170b, 270b can also comprise an average contact angle with water of at least 70 degrees after being subjected to 3,500 reciprocating cycles under a load of 1 kg according to the Steel Wool Test. In other aspects, an average contact angle of at least 70 degrees, 75 degrees, 80 degrees, 85 degrees, 90 degrees, 95 degrees, 100 degrees, 105 degrees, 110 degrees, or 115 degrees (including all average contact angles between these levels) with water is retained by the surface after 2,000, or 3,500, of such cycles according to the Steel Wool Test. Still further, some embodiments of the articles 100, 200, 300 of the disclosure are configured such that an exposed surface of the ETC coating comprises an average contact angle with water of at least 70 degrees after being subjected to over 3,500 reciprocating cycles under a load of 1 kg according to the Steel Wool Test.

As used herein, the "Steel Wool Test" is a test employed to determine the durability of an ETC coating disposed over a glass, glass-ceramic or ceramic substrate (e.g., substrate 10, 110 as shown in FIGS. 1, 2A and 2B) employed in the articles of the disclosure (e.g., articles 100, 200, 300 depicted in FIGS. 1, 2A and 2B). At the beginning of a Steel Wool Test, a water contact angle is measured on the particular sample one or more times to obtain a reliable initial water contact angle. These water contact angle measurements can be conducted using a Krüss GmbH DSA100 drop shape analyzer or similar instrument. After the initial water contact angle is measured, a pad of Bonstar #0000 steel wool is affixed to an arm of a Taber® Industries 5750 linear abraser instrument. The steel wool pad was then allowed to make contact with the sample (on the ETC coating) under a load of 1 kg and set to reciprocate at 60 cycles/min. The average contact angle is then measured on the sample after 2,000 cycles, 3,500 cycles and/or another specified duration. Without being bound by theory, variants of the Steel Wool Test can be employed, e.g., with reciprocating abrasion cycles by a cloth instead of by a steel wool pad. Those with ordinary skill in the field of the disclosure can then extrapolate the characteristics of the articles of the disclosure given in terms of the Steel Wool Test (e.g., average contact angle after a set number of cycles) to any such variants.

In embodiments, the article 100, 200, 300 (see FIGS. 1, 2A and 2B) is configured to ensure minimal to no discernible haze associated with the ETC coating. For example, these articles can comprise a haze through the ETC coating 70, 170b, 270b and the glass, glass-ceramic or ceramic substrate 10, 110 of less than or equal to about 5 percent. In certain aspects, the haze is equal to or less than 5 percent, 4.5 percent, 4 percent, 3.5 percent, 3 percent, 2.5 percent, 2 percent, 1.5 percent, 1 percent, 0.75 percent, 0.5 percent, or 0.25 percent (including all levels of haze between these levels) through the ETC coating 70, 170b, 270b and the glass substrate 10, 110. In other embodiments, the article 100, 200, 300 comprises an optical coating 80 in the form of an anti-glare structure, which is by nature hazy; consequently, the level of haze through the ETC coating 70, 170b, 270b, the anti-glare structure of the optical coating 80 and the substrate 10, 110 can be set at 10 percent or higher, 5 percent or higher, or another haze level above these lower haze limits. In other implementations, articles 100, 200, 300 that incorporate appreciable haze (>5%) as part of their function (and not limited to those articles employing an optical coating 80 having an anti-glare structure), the ETC coatings of the disclosure, and the methods for fabricating them herein, can be employed to improve ETC coating durability while maintaining or otherwise controlling haze to the desired level for the particular application. As used herein, the term "haze" refers to the percentage of transmitted light scattered outside an angular cone of about ±2.5° in accordance with ASTM procedure D1003, entitled "Standard Test Method for Haze and Luminous Transmittance of Transparent Plastics," the contents of which is incorporated by reference herein in its entirety. For an optically smooth surface, transmission haze is generally close to zero.

The ETC coating 70, 170b, 270b employed in the articles of the disclosure can be applied in various ways on or over one or more primary surfaces 12, 14, 112, 114 of the substrate 10, 100 (see FIGS. 1, 2A and 2B). According to some embodiments, the bound and mobile ETC components of the ETC coating can be deposited by various methods, including but not limited to, spray coating, dip coating, spin coating, and vapor deposition. Vapor deposition approaches for depositing the ETC coating can include, but are not limited to, physical vapor deposition ("PVD"), electron beam deposition ("e-beam" or "EB"), ion-assisted deposition-EB ("IAD-EB"), laser ablation, vacuum arc deposition, thermal evaporation, sputtering, plasma enhanced chemical vapor deposition (PECVD) and other similar vapor deposition techniques.

According to another embodiment, a method of making the articles of the disclosure (e.g., the articles 100, 200, 300 depicted in FIGS. 1, 2A and 2B) can include: depositing an easy-to-clean (ETC) coating precursor over a primary surface of a glass, glass-ceramic or ceramic substrate; curing the ETC coating precursor to define a cured ETC coating precursor that comprises a bound ETC component; and processing the cured ETC coating precursor to define an ETC coating (e.g., ETC coating 70, 170b, 270b) that comprises the bound ETC component and a mobile ETC component. Further, the bound ETC component comprises a perfluoropolyether (PFPE) silane and a thickness between about 1 nm and about 20 nm. In addition, the mobile ETC component is disposed on or within the bound ETC component and comprises a fluorinated material, the mobile ETC component configured for movement relative to the bound ETC component.

According to an embodiment, the method can be conducted such that the mobile ETC component comprises the PFPE silane of the bound ETC component. Further, the processing step can include a controlled wipe of the cured ETC coating precursor to define the ETC coating (e.g., ETC coating 70, 170b, 270b). In embodiments, the method is conducted such that the article comprises a haze through the ETC coating and the substrate of less than or equal to about 5 percent as-prepared after the curing step or, in some cases, after the processing step. In addition, the processing step can be conducted by any of a variety of manual, semi-manual or automated techniques, such as light brushing, short solvent dips, automated wiping, etc. For example, as shown schematically in FIG. 2A, an article 200 can be made by conducting a depositing step 210 to deposit an ETC coating precursor over the primary surface 112 of a silica-containing, glass, glass-ceramic or ceramic substrate 110. After the precursor has been deposited, it can then be cured during a curing step 220 for a temperature and time that is suitable for the particular PFPE composition of the precursor to define a cured ETC precursor 170a. The cured ETC coating precursor includes a bound ETC component 172 and a mobile ETC component 176a. In essence, the mobile ETC component 176a is a remaining, excess portion of the ETC material that is bound to the substrate as the bound ETC component 172. At this point in the method depicted in FIG. 2A, the cured ETC precursor 170a is processed with a controlled wipe in a wiping step 230 to define the ETC coating 170b. As used herein, the terms "a controlled wipe" and "a controlled wiping" refer to any wipe of a cured ETC coating or precursor by a mechanical means (e.g., manual, semimanual, and/or automated including but not limited to light brushing, fiber cloth wiping, etc.) with or without a solvent (e.g., a fiber cloth lightly saturated with isopropyl alcohol) that results in a residual layer of at least a monolayer (i.e., a molecule in size or greater) or a plurality of droplets of mobile ETC material over a bound ETC component. As shown in step 230a, the ETC coating 170b that results from the wiping step 230 includes a bound ETC component 172 and a mobile ETC component 176b.

According to another embodiment, the method can be conducted such that the processing of the cured ETC coating precursor can comprise depositing a PFPE oil over the cured ETC coating precursor to define the ETC coating, wherein the mobile ETC component comprises the PFPE oil. The method, in some aspects, can also be conducted such that the processing of the cured ETC coating precursor further comprises rinsing the cured ETC coating precursor with a solvent prior to the step of depositing the PFPE oil over the cured ETC coating precursor, and further wherein the rinsing is conducted to remove an excess amount of at least one of the ETC coating precursor and the cured ETC coating precursor over the primary surface of the substrate. For example, as shown schematically in FIG. 2B, an article 300 can be made by conducting a depositing step 310 to deposit an ETC coating precursor over the primary surface 112 of a silica-containing, glass, glass-ceramic or ceramic substrate 110. After the precursor has been deposited, it can then be cured during a curing step 320 for a temperature and time that is suitable for the particular PFPE composition of the precursor to define a cured ETC precursor 270a. The cured ETC coating precursor includes a bound ETC component 272 and a mobile ETC component 276a. In essence, the mobile ETC component 276a is a remaining, excess portion of the ETC material that is bound to the substrate as the bound ETC component 272. At this point in the method depicted in FIG. 2B, the cured ETC precursor 270a is processed with a rinsing step 330, e.g., an ultrasonic solvent rinse, to remove the excess portion of the ETC material, i.e., the mobile ETC component 276a. After completion of the rinsing step 330, the bound ETC component 272 remains on the substrate 110 and the mobile ETC component has been removed. The method can then be conducted such that a deposition step 340 is conducted in which PFPE oil is deposited over the bound ETC component 272 (for example, by spraying). As shown in step 340a, the resulting article 300 is configured such that the PFPE oil is the mobile ETC component 276b, as arranged over the bound ETC component 272.

Figure 8A:
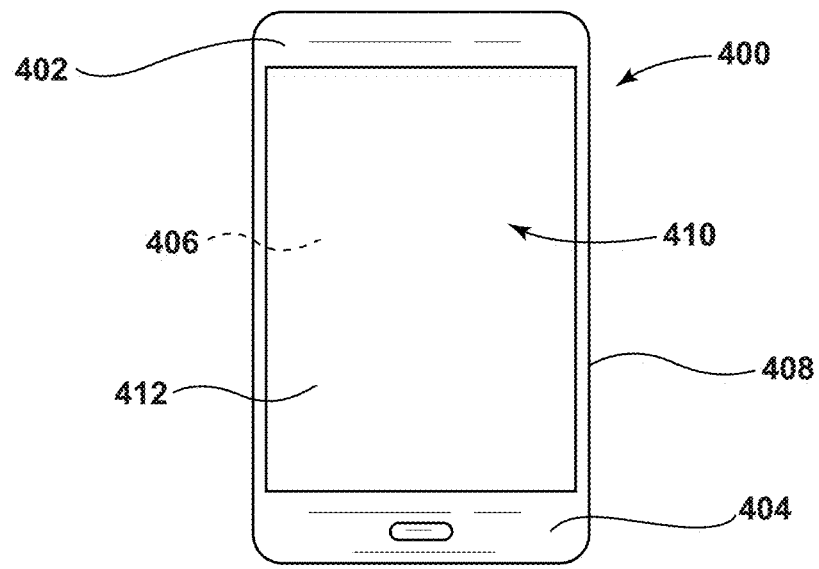
FIG. 8A is a plan view of an exemplary electronic device incorporating any of the articles disclosed herein.
Figure 8B:
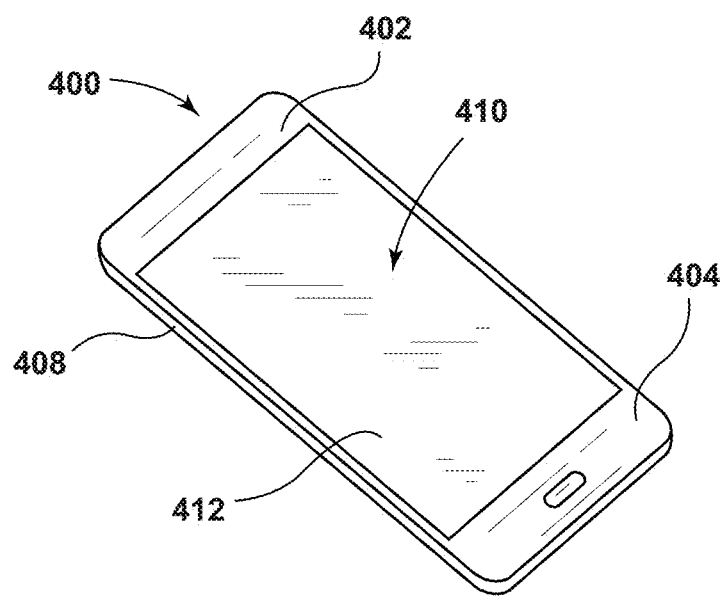
FIG. 8B is a perspective view of the exemplary electronic device of FIG. 8A.

The articles disclosed herein may be incorporated into another article such as an article with a display (or display articles) (e.g., consumer electronics, including mobile phones, tablets, computers, navigation systems, and the like), architectural articles, transportation articles (e.g., automotive, trains, aircraft, sea craft, etc.), appliance articles, or any article that requires some transparency, anti-smudge/anti-fingerprint properties, scratch-resistance, abrasion resistance or a combination thereof. An exemplary article incorporating any of the glass articles disclosed herein is shown in FIGS. 8A and 8B. Specifically, FIGS. 8A and 8B show a consumer electronic device 400 including a housing 402 having front 404, back 406, and side surfaces 408; electrical components (not shown) that are at least partially inside or entirely within the housing and including at least a controller, a memory, and a display 410 at or adjacent to the front surface of the housing; and a cover substrate 412 at or over the front surface of the housing such that it is over the display. In some embodiments, at least one of the cover substrate 412 or a portion of housing 402 may include any of the glass, glass-ceramic, or ceramic articles disclosed herein.

EXAMPLES

The following examples represent certain non-limiting embodiments of the disclosure.

Example 1

Figure 4:
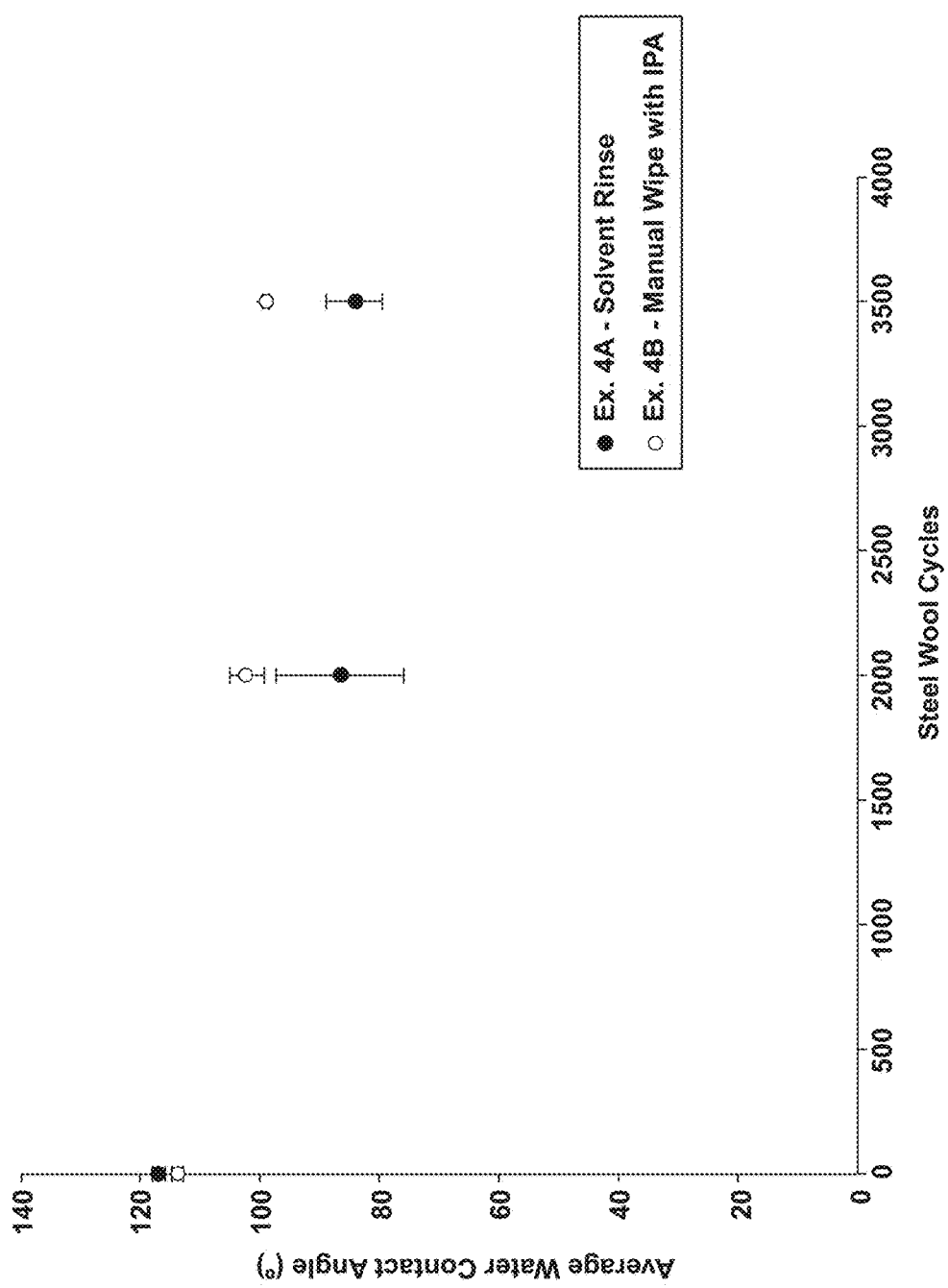
FIG. 4 is a chart of average water contact angle as a function of reciprocating cycles according to the Steel Wool test for substrates having an optical coating and coated with a PFPE silane and subjected to a manual wiping or a solvent rinse evolution, according to embodiments of the disclosure.

As shown in FIG. 4, a chart of average water contact angle as a function of reciprocating cycles according to the Steel Wool test for glass substrates coated with a PFPE silane and subjected to a manual wiping (Ex. 4B) or a solvent rinse (Ex. 4A) evolution, according to embodiments of the disclosure. That is, in Example 1, articles were fabricated according to principles of the disclosure with strengthened glass substrates and an optical, AR coating disposed on a primary surface of the substrates. These substrates were then coated with an ETC coating comprising a PFPE silane over the optical coating and then cured. A group of these samples was subjected to a solvent rinse with 3M™ Novec™ 7200 engineered fluid, designated "Ex. 4A"; and the other group of samples was subjected to a controlled, wiping evolution that comprised a manual wiping action with a soft, lint-free cloth lightly saturated with isopropyl alcohol (IPA), designated "Ex. 4B." As shown in FIG. 4, the Ex. 4B samples subjected to the manual wiping evolution retained an average contact angle of about 100 degrees after 3,500 cycles in the Steel Wool Test. In contrast, the Ex. 4A samples subjected to a solvent rinse retained an average contact angle of less than about 90 degrees after 3,500 cycles in the Steel Wool Test. As such, an article with an ETC coating can retain significant ETC coating durability by the use of a processing method, e.g., manual wiping, which ensures that an appreciable amount of ETC coating remains, functioning as a mobile ETC component, over a bound ETC component. In other words, it is believed that the solvent rinse minimized and/or removed a mobile ETC component, thereby resulting in a lower average contact angle for the Ex. 4A samples.

Example 2

Figure 5:
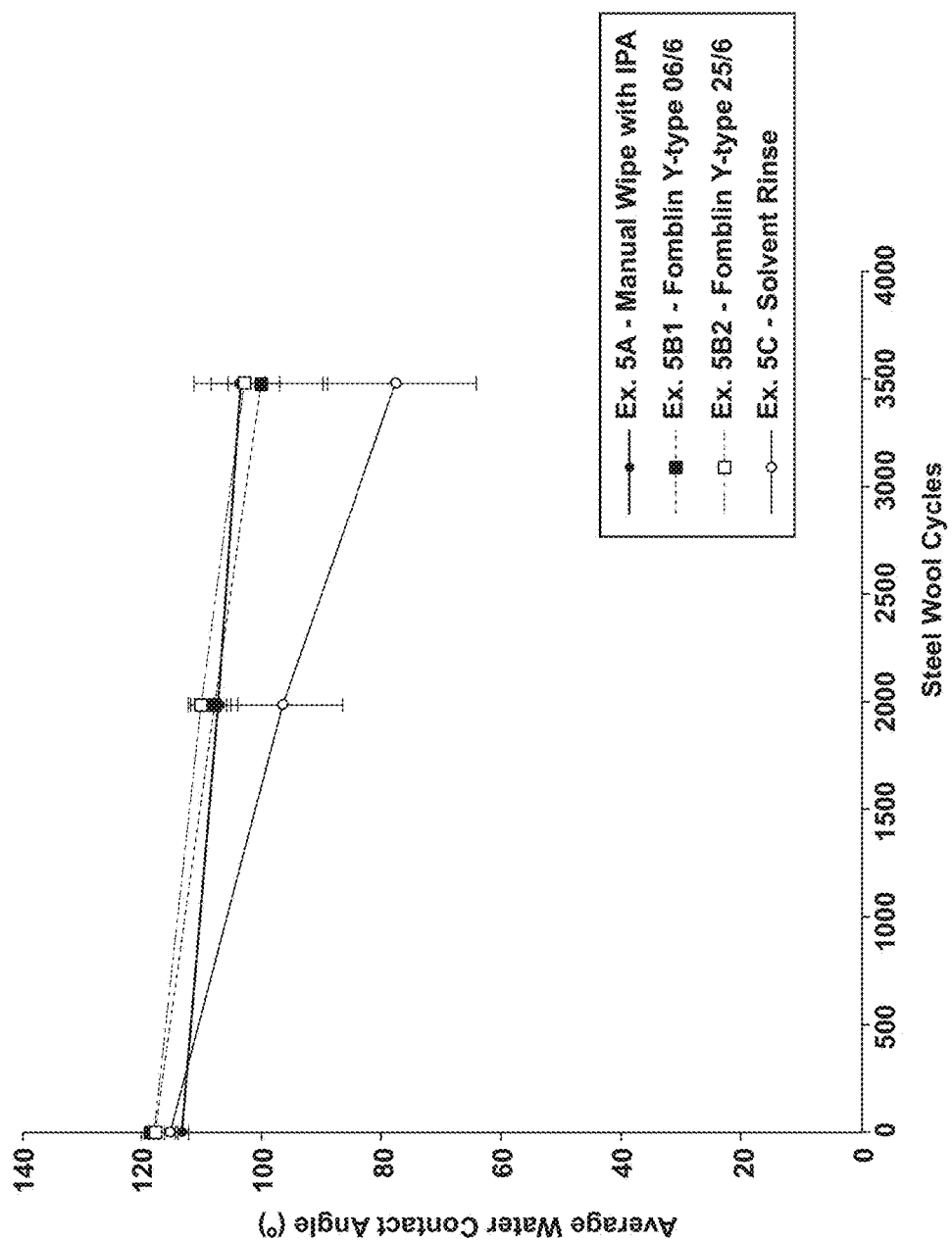
FIG. 5 is a chart of average water contact angle as a function of reciprocating cycles according to the Steel Wool test for substrates having an optical coating and coated with a PFPE silane and subjected to a manual wiping evolution, solvent rinse evolution or a solvent rinse and a Fomblin® Y-type PFPE oil application, according to embodiments of the disclosure.

As shown in FIG. 5, a chart of average water contact angle as a function of reciprocating cycles according to the Steel Wool test for glass substrates coated with a PFPE silane and subjected to a manual wiping evolution (Ex. 5A), solvent rinse evolution (Ex. 5C) or a solvent rinse and a Fomblin® Y-type PFPE oil application (Exs. 5B1 & 5B2), according to embodiments of the disclosure. That is, in Example 2, articles were fabricated according to principles of the disclosure with strengthened glass substrates and an optical, AR coating disposed on a primary surface of the substrates. These substrates were then coated with an ETC coating comprising a PFPE silane (Optool™ UF503 PFPE) over the optical coating and then cured. A group of these samples was subjected to a solvent rinse (i.e., with a 3M™ Novec™ 7200 Engineered Fluid), designated "Ex. 5C"; and another group of samples was subjected to a controlled wiping evolution (i.e., with a soft, lint-free cloth lightly saturated with IPA), designated "Ex. 5A." Further, two sets of samples were subjected to a solvent rinse and then sprayed with Fomblin® Y 06/6 and 25/6 PFPE oil, designated "Exs. 5B1 and 5B2," respectively. Of these samples, the group subjected to a solvent rinse without any PFPE oil (Ex. 5C) fared the worst, registering an average water contact angle of less than 100 degrees (about 80 degrees) after 3,500 cycles in the Steel Wool Test. Without being bound by theory, samples subjected to a solvent rinse, such as Ex. 5C, register low ETC coating durability as the rinsing is believed to remove excess ETC and any exposed silane groups leading to increases in contact angle. In contrast, the samples with PFPE oil (Exs. 5B1 & 5B2) and excess ETC by virtue of being subjected to a controlled, manual wipe (Ex. 5A) (rather than a solvent rinse) retained an average contact angle of about 100-105 degrees after 3,500 cycles in the Steel Wool Test.

As shown below in Table 1, surface energy measurements performed on the samples in Example 2 demonstrate similar trends as observed in the Steel Wool Test. These surface energy measurements were performed on a Krüss DSA100 drop shape analyzer using the Wu method with three fluids, as understood by those with ordinary skill in the field of the disclosure. In Table 1, "W" is the contact angle measured for water; "HD" is the contact angle measured for hexadecane; and "DIM" is the contact angle measured for diiodomethane, all in units of degrees. Further, "D," "P" and "T" are the measured dispersive surface energy component, polar surface energy component and total surface energy values, respectively, for each sample in units of milliNewtons per meter (mN/m). In particular, Table 1 shows that the surface energy measurements of the Fomblin® Y-type PFPE oil samples (Exs. 5B1 & 5B2) were similar to the control sample subjected to a solvent rinse and no additional PFPE oil (Ex. 5C). In contrast, the samples subjected to an ETC coating followed by a controlled, manual wiping (Ex. 5A) exhibited slightly higher polar and dispersive components, and total surface energy, compared to the other samples (Exs. 5B1, 5B2 and 5C). Without being bound by theory, it is believed that the higher total surface energy and surface energy component values for the sample subjected to a controlled wipe with IPA is the result of the controlled wiping leaving a thin layer of mobile ETC, i.e., an amount of unreacted silanes.

PFPE oil application (Ex. 6B1), or a solvent rinse and a Fomblin® Z-type PFPE oil application (Ex. 6B2), according to embodiments of the disclosure. That is, in Example 3, articles were fabricated according to principles of the disclosure consistent with the samples prepared in Examples 1 and 2. These substrates were then coated with an ETC coating comprising a PFPE silane (Optool™ UF503 PFPE) over the optical coating and then cured. A group of these samples was subjected to a solvent rinse (HFE 7200 solvent), designated "Ex. 6C"; and another group of samples was subjected to a controlled, manual wiping evolution, designated "Ex. 6A." Further, two sets of samples were subjected to a solvent rinse and then sprayed with Demnum™ and Fomblin® Z-type PFPE oil, designated "Exs. 6B1 and 6B2," respectively. Of these samples, the group subjected to a solvent rinse without any PFPE oil (Ex. 6C) fared the worst, registering an average water contact angle of less than 60 degrees after just 2000 cycles in the Steel Wool Test. In contrast, the samples with PFPE oil (Exs. 6B1 & 6B2) and excess ETC by virtue of being subjected to a controlled, manual wipe (Ex. 6A) (rather than a solvent rinse) retained an average contact angle of nearly 60 degrees or greater after 3500 cycles in the Steel Wool Test.

Example 4

Figure 7:
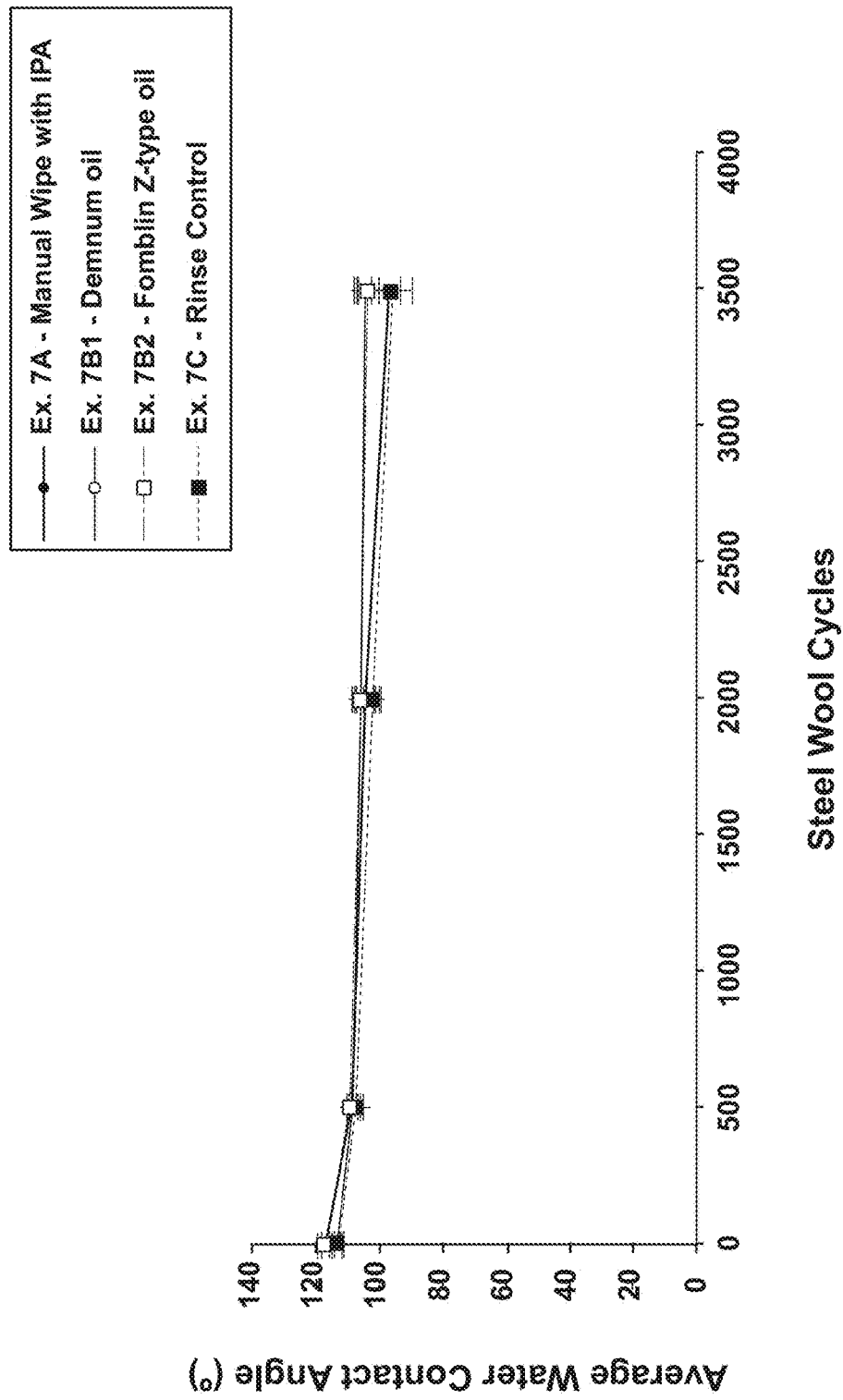
FIG. 7 is a chart of average water contact angle as a function of reciprocating cycles according to the Steel Wool test for substrates having an optical coating, fabricated at a different facility than those of FIG. 6, coated with a PFPE silane and then subjected to a manual wiping evolution, solvent rinse evolution, a solvent rinse and a Fomblin® Z PFPE oil application, or a solvent rinse and a Demnum™ PFPE oil application, according to embodiments of the disclosure.

As shown in FIG. 7, a chart of average water contact angle as a function of reciprocating cycles according to the Steel Wool test for glass substrates coated with a PFPE silane and subjected to a manual wiping evolution (Ex. 7A), a solvent rinse evolution (Ex. 7C), a solvent rinse and a Demnum™ PFPE oil application (Ex. 7B1), or a solvent rinse and a Fomblin® Z-type PFPE oil application (Ex. 7B2), according to embodiments of the disclosure. That is, in Example 4, articles were fabricated consistent with those employed in Example 3, but at a different manufacturing facility. These substrates were then coated with an ETC coating comprising a PFPE silane (Optool™ UF503 PFPE) over the optical coating and then cured. A group of these samples was subjected to a solvent rinse (HFE 7200 solvent), designated "Ex. 7C"; and another group of samples was subjected to a controlled, manual wiping evolution, designated "Ex. 7A." Further, two sets of samples were subjected to a solvent rinse and then sprayed with Demnum™ and Fomblin® Z-type PFPE oil, designated "Exs. 7B1 and 7B2," respectively. Of these samples, the group subjected to a solvent rinse without any PFPE oil (Ex. 7C) fared the worst, registering an average water contact angle of about 95 degrees after 3500 cycles in the Steel Wool Test. In contrast, the samples with

TABLE 1

| Sample | ETC | Treatment | W | HD (degrees) | DIM | D | P (mN/m) | T |
|---|---|---|---|---|---|---|---|---|
| Ex. 5A | Spray UF503 | Manual wipe with IPA | 115.57 | 66.2 | 91.3 | 15.48 | 1.32 | 16.8 |
| Ex. 5B1 | Spray UF503 | Rinse, Fomblin ® Y 06/6 | 120.6 | 71.07 | 101.2 | 13.35 | 0.67 | 14.02 |
| Ex. 5B1 | Spray UF503 | Rinse, Fomblin ® Y 25/6 | 119.63 | 71.27 | 100.47 | 13.41 | 0.93 | 14.34 |
| Ex. 5C | Spray UF503 | Solvent rinse | 119.57 | 71.57 | 99.07 | 13.55 | 0.9 | 14.45 |

Example 3

Figure 6:
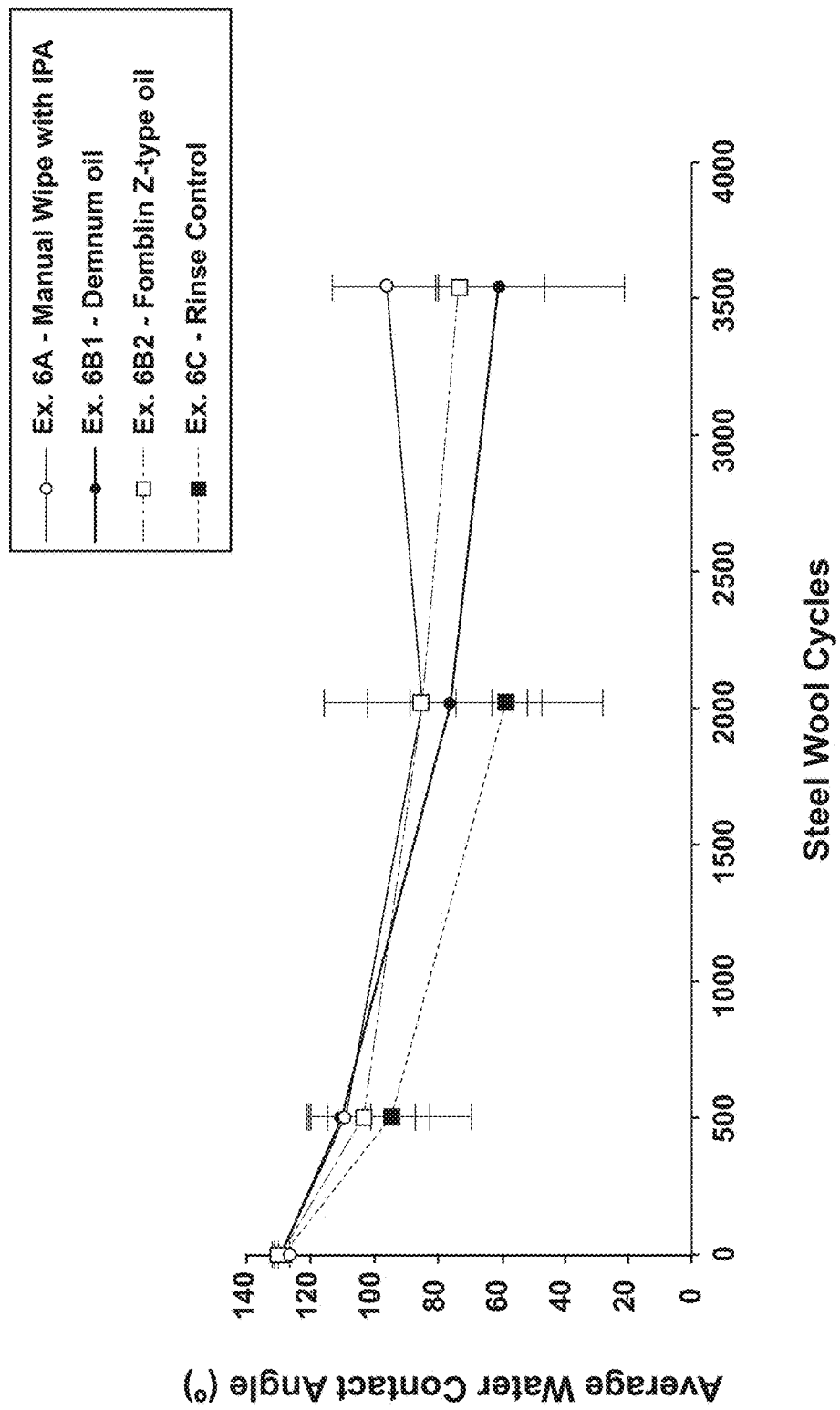
FIG. 6 is a chart of average water contact angle as a function of reciprocating cycles according to the Steel Wool test for substrates having an optical coating and coated with a PFPE silane and subjected to a manual wiping evolution, solvent rinse evolution, a solvent rinse and a Fomblin® Z PFPE oil application, or a solvent rinse and a Demnum™ PFPE oil application, according to embodiments of the disclosure.

As shown in FIG. 6, a chart of average water contact angle as a function of reciprocating cycles according to the Steel Wool test for glass substrates coated with a PFPE silane and subjected to a manual wiping evolution (Ex. 6A), a solvent rinse evolution (Ex. 6C), a solvent rinse and a Demnum™

PFPE oil (Exs. 7B1 & 7B2) and excess ETC by virtue of being subjected to a controlled, manual wipe (Ex. 7A) (rather than a solvent rinse) retained an average contact angle of about 100 degrees or greater after 3500 cycles in the Steel Wool Test.

Many variations and modifications may be made to the above-described embodiments of the disclosure without departing substantially from the spirit and various principles of the disclosure. All such modifications and variations are intended to be included herein within the scope of this disclosure and protected by the following claims.

What is claimed is:

1. An article, comprising:
a glass, glass-ceramic or ceramic substrate comprising a primary surface; and
an easy-to-clean (ETC) coating disposed over the primary surface, the coating comprising a bound ETC component and a mobile ETC component,
wherein the bound ETC component comprises a perfluoropolyether (PFPE) silane, and
further wherein the mobile ETC component is disposed on or within the bound ETC component and comprises a fluorinated material, the mobile ETC component configured for movement relative to the bound ETC component.

2. The article according to claim 1, wherein the mobile ETC component is at least partially soluble within the bound ETC component.

3. The article according to claim 1, wherein an exposed surface of the ETC coating comprises an average contact angle with water of at least 70 degrees after being subjected to 2000 reciprocating cycles under a load of 1 kg according to a Steel Wool Test.

4. The article according to claim 1, wherein an exposed surface of the ETC coating comprises an average contact angle with water of at least 70 degrees after being subjected to 3500 reciprocating cycles under a load of 1 kg according to a Steel Wool Test.

5. The article according to claim 1, wherein the article comprises a haze through the coating and the substrate of less than or equal to about 5 percent.

6. The article according to claim 1, wherein the substrate comprises a glass composition and a compressive stress region, the compressive stress region extending from the primary surface to a first selected depth in the substrate.

7. The article according to claim 1, wherein the mobile ETC component comprises the PFPE silane of the bound ETC component.

8. The article according to claim 1, further comprising:
an optical coating disposed between the primary surface of the substrate and the ETC coating, wherein the optical coating is a multilayer coating.

9. The article according to claim 1, further comprising:
a scratch-resistant coating disposed between the primary surface of the substrate and the ETC coating, wherein the scratch-resistant coating comprises at least one of a metal oxide and a metal nitride.

10. The article according to claim 1, wherein the bound ETC component further comprises a thickness between about 1 nm and about 20 nm.

11. A consumer electronic product, comprising:
a housing having a front surface, a back surface and side surfaces;
electrical components provided at least partially within the housing, the electrical components including at least a controller, a memory, and a display, the display being provided at or adjacent the front surface of the housing; and
a cover substrate disposed over the display,
wherein at least one of a portion of the housing or the cover substrate comprises the article of claim 1.

12. An article, comprising:
a glass, glass-ceramic or ceramic substrate comprising a primary surface; and
an easy-to-clean (ETC) coating disposed over the primary surface, the coating comprising a bound ETC component and a mobile ETC component,
wherein the bound ETC component comprises a perfluoropolyether (PFPE) silane, and
further wherein the mobile ETC component is disposed on the bound ETC component and comprises a PFPE oil, the mobile ETC component configured for movement relative to the bound ETC component.

13. The article according to claim 12, wherein an exposed surface of the ETC coating comprises an average contact angle with water of at least 70 degrees after being subjected to 2000 reciprocating cycles under a load of 1 kg according to a Steel Wool Test.

14. The article according to claim 12, wherein an exposed surface of the ETC coating comprises an average contact angle with water of at least 70 degrees after being subjected to 3500 reciprocating cycles under a load of 1 kg according to a Steel Wool Test.

15. The article according to claim 12, wherein the article comprises a haze through the coating and the substrate of less than or equal to about 5 percent.

16. The article according to claim 12, wherein the substrate comprises a glass composition and a compressive stress region, the compressive stress region extending from the primary surface to a first selected depth in the substrate.

17. The article according to claim 12, further comprising:
an optical coating disposed between the primary surface of the substrate and the ETC coating, wherein the optical coating is a multilayer coating.

18. The article according to claim 12, further comprising:
a scratch-resistant coating disposed between the primary surface of the substrate and the ETC coating, wherein the scratch-resistant coating comprises at least one of a metal oxide and a metal nitride.

19. The article according to claim 12, wherein the bound ETC component further comprises a thickness between about 1 nm and about 20 nm.

20. A consumer electronic product, comprising:
a housing having a front surface, a back surface and side surfaces;
electrical components provided at least partially within the housing, the electrical components including at least a controller, a memory, and a display, the display being provided at or adjacent the front surface of the housing; and
a cover substrate disposed over the display,
wherein at least one of a portion of the housing or the cover substrate comprises the article of claim 12.

21. A method of making an article, comprising:
depositing an easy-to-clean (ETC) coating precursor over a primary surface of a glass, glass-ceramic or ceramic substrate;
curing the ETC coating precursor to define a cured ETC coating precursor that comprises a bound ETC component; and
processing the cured ETC coating precursor to define an ETC coating that comprises the bound ETC component and a mobile ETC component,
wherein the bound ETC component comprises a perfluoropolyether (PFPE) silane, and
further wherein the mobile ETC component is disposed on or within the bound ETC component and comprises a fluorinated material, the mobile ETC component configured for movement relative to the bound ETC component.

22. The method according to claim 21, wherein the mobile ETC component comprises the PFPE silane of the bound ETC component and the processing comprises a controlled wipe of the cured ETC coating precursor to define the ETC coating.

23. The method according to claim 21, wherein the article comprises a haze through the ETC coating and the substrate of less than or equal to about 5 percent after the curing step.

24. The method according to claim 21, wherein the processing of the cured ETC coating precursor comprises depositing a PFPE oil over the cured ETC coating precursor to define the ETC coating, wherein the mobile ETC component comprises the PFPE oil.

25. The method according to claim 24, wherein the processing of the cured ETC coating precursor further comprises rinsing the cured ETC coating precursor with a solvent prior to the step of depositing the PFPE oil over the cured ETC coating precursor, and further wherein the rinsing is conducted to remove an excess amount of at least one of the ETC coating precursor and the cured ETC coating precursor over the primary surface of the substrate.

26. The method according to claim 21, wherein the bound ETC component further comprises a thickness between about 1 nm and about 20 nm.

* * * * *